United States Patent
Bikumandla

(10) Patent No.: US 8,569,700 B2
(45) Date of Patent: Oct. 29, 2013

(54) IMAGE SENSOR FOR TWO-DIMENSIONAL AND THREE-DIMENSIONAL IMAGE CAPTURE

(75) Inventor: Manoj Bikumandla, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 11 days.

(21) Appl. No.: 13/413,456

(22) Filed: Mar. 6, 2012

(65) Prior Publication Data

US 2013/0234029 A1 Sep. 12, 2013

(51) Int. Cl.
*G01J 5/02* (2006.01)

(52) U.S. Cl.
USPC .......................................................... 250/349

(58) Field of Classification Search
USPC ................. 250/338.1–338.5, 339.01–339.15, 250/342–352
See application file for complete search history.

(56) References Cited

U.S. PATENT DOCUMENTS

| | | | |
|---|---|---|---|
| 6,580,496 B2 | 6/2003 | Bamji et al. | |
| 7,247,851 B2 * | 7/2007 | Okada et al. | 250/339.02 |
| 8,288,837 B2 * | 10/2012 | Aurola | 257/447 |
| 8,350,217 B2 * | 1/2013 | Sa et al. | 250/349 |
| 2005/0056902 A1 * | 3/2005 | Abe et al. | 257/428 |
| 2011/0175981 A1 * | 7/2011 | Lai et al. | 348/46 |

OTHER PUBLICATIONS

U.S. Appl. No. 13/241,032, filed Sep. 22, 2011, Bikumandla et al.
Gokturk, S. B., et al., "A Time-Of-Flight Depth Sensor—System Description, Issues and Solutions," Proceedings of the 2004 IEEE Computer Society Conference on Computer Vision and Pattern Recognition Workshops (CVPRW'04) (9 pages).
Kim, S., et al., "A Three-Dimensional Time-of-Flight CMOS Image Sensor With Pinned-Photodiode Pixel Structure," IEEE Electron Device Letters, vol. 31, No. 11, Nov. 2010 (3 pages).

* cited by examiner

*Primary Examiner* — Kiho Kim
(74) *Attorney, Agent, or Firm* — Blakely Sokoloff Taylor & Zafman LLP

(57) ABSTRACT

An apparatus includes a first photodetector array including visible light photodetectors disposed in semiconductor material to detect visible light included in light incident upon the semiconductor material. The apparatus also includes a second photodetector array including time of flight ("TOF") photodetectors disposed in the semiconductor material to capture TOF data from reflected light reflected from an object included in the light incident upon the semiconductor material. The reflected light reflected from the object is directed to the TOF photodetectors along an optical path through the visible light photodetectors and through a thickness of the semiconductor material. The visible light photodetectors of the first photodetector array are disposed in the semiconductor material along the optical path between the object and the TOF photodetectors of the second photodetector array.

20 Claims, 9 Drawing Sheets

IMAGE SENSOR FOR TWO-DIMENSIONAL AND THREE-DIMENSIONAL IMAGE CAPTURE

TECHNICAL FIELD

This disclosure relates generally to sensors, and in particular but not exclusively, relates to image sensors with three-dimensional imaging capability.

BACKGROUND INFORMATION

Image sensors are used in a wide variety of applications, for example, digital cameras, cellular phones, security cameras, optical mice, as well as various other medical, automobile, military, or other applications. Interest in image sensors with three-dimensional ("3D") imaging capability is increasing as the popularity of 3D applications continues to grow in applications such as imaging, movies, games, computers, user interfaces, and the like. A typical passive way to create 3D images is to use multiple cameras to capture stereo or multiple images. Using the stereo images, objects in the images can be triangulated to create the 3D image. One disadvantage with this triangulation technique is that it is difficult to create 3D images using small devices because there must be a minimum separation distance between each camera in order to create the three dimensional images. In addition, this technique is complex and therefore requires significant computer processing power in order to create the 3D images in real time.

Some applications (e.g. gesture recognition and gaming) benefit from the acquisition of both two-dimensional (2D) images and 3D images. Using the triangulation technique to acquire 3D images and combining the 3D images with 2D images also requires significant processing power. To acquire 3D images in real time, active depth imaging systems based on optical time of flight measurement are sometimes utilized. These time of flight systems typically employ a light source that directs light at an object, a sensor that detects the light that is reflected from the object, and a processing unit that calculates the distance to the object based on the round trip time that it takes for light to travel to and from an object. Some known time of flight sensors attempt to capture 2D images with the same photodetectors that capture the 3D time of flight images by sharing the frame time of the photodetectors in the sensor between 2D imaging and 3D time of flight imaging. However, this requires relatively high speed circuits and may result in poor signal for both 2D and 3D image capture due to low exposure durations.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Methods and apparatuses for acquiring 2D and 3D images are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. For example, the term "or" is used in the inclusive sense (e.g., as in "and/or") unless the context clearly indicates otherwise.

As will be shown, examples of an image sensor that can simultaneously capture 2D and 3D images are disclosed. Coupling a 2D image sensor above a 3D TOF image sensor may allow each image sensor to receive light for a longer period of time (compared to using one photodetector to capture both 2D and 3D image data) which improves signal to noise ratios. Another potential advantage of coupling a 2D image sensor above a 3D TOF image sensor is that the processing power required to compare or use the 2D image in connection with the 3D image may be reduced.

Figure 1:
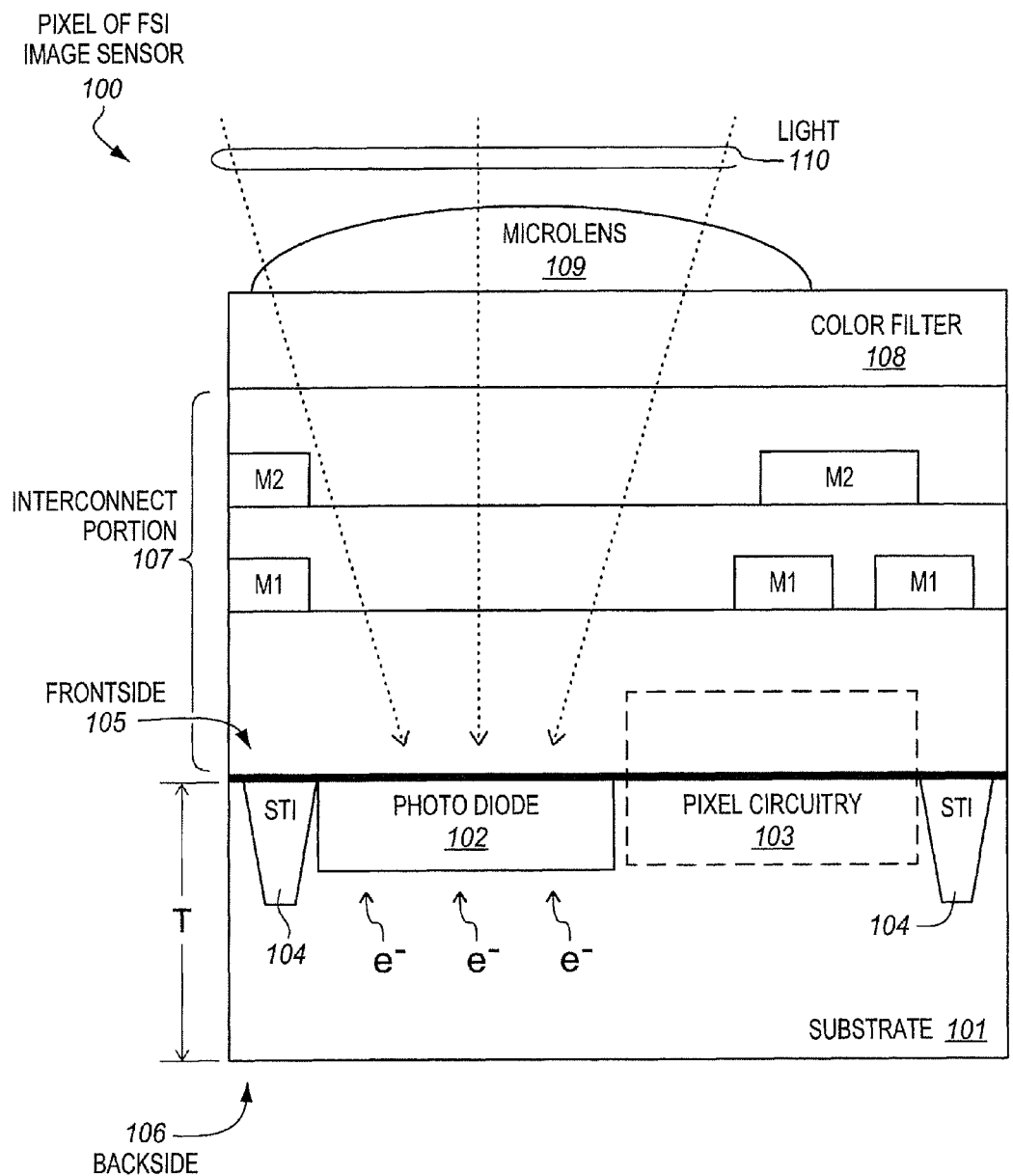
FIG. 1 is a cross-sectional side view of a prior art frontside illuminated (FSI) pixel for an FSI image sensor.

FIG. 1 is a cross-sectional side view of a prior art frontside illuminated (FSI) pixel 100 for a FSI image sensor. For simplicity, a single pixel is shown, although typically there will be a two-dimensional array of such pixels. The pixel includes a substrate 101, an interconnect portion 107 over the substrate, a color filter 108 over the interconnect portion, and a microlens 109 over the color filter. The substrate 101 has a frontside 105 and a backside 106. The frontside is the side of the substrate over which the interconnect portion 107 is disposed.

A photodiode 102, pixel circuitry 103, and shallow trench isolation (STI) 104, are disposed within a frontside portion of the substrate 101. The interconnect portion 107 is used to convey signals to and from the pixel circuitry 103. The illustrated interconnect portion includes three insulating or dielectric layers within which two metal layers (labeled M1 and M2) are disposed. The metal layers represent metal lines, traces, or other interconnects. The metal layers or interconnects are generally patterned or arranged in order to form an opening or optical passage through which light 110, which is provided from frontside 105, may reach photodiode 102.

A portion of light 110 that is able to pass through color filter 108 may be transmitted through the dielectric layers of interconnect portion 107 and into a material (e.g., a silicon or other semiconductor material) of the substrate 101. The light may penetrate into the material of the substrate to a depth that is based on the wavelength of the light before generating the charge carriers. Provided that the material has sufficient thickness, at least some of the light may tend to free charge carriers in the material. As shown, photogenerated charge carriers, such as electrons (e−), may be generated or freed in the material, such as a semiconductor material.

Figure 2:
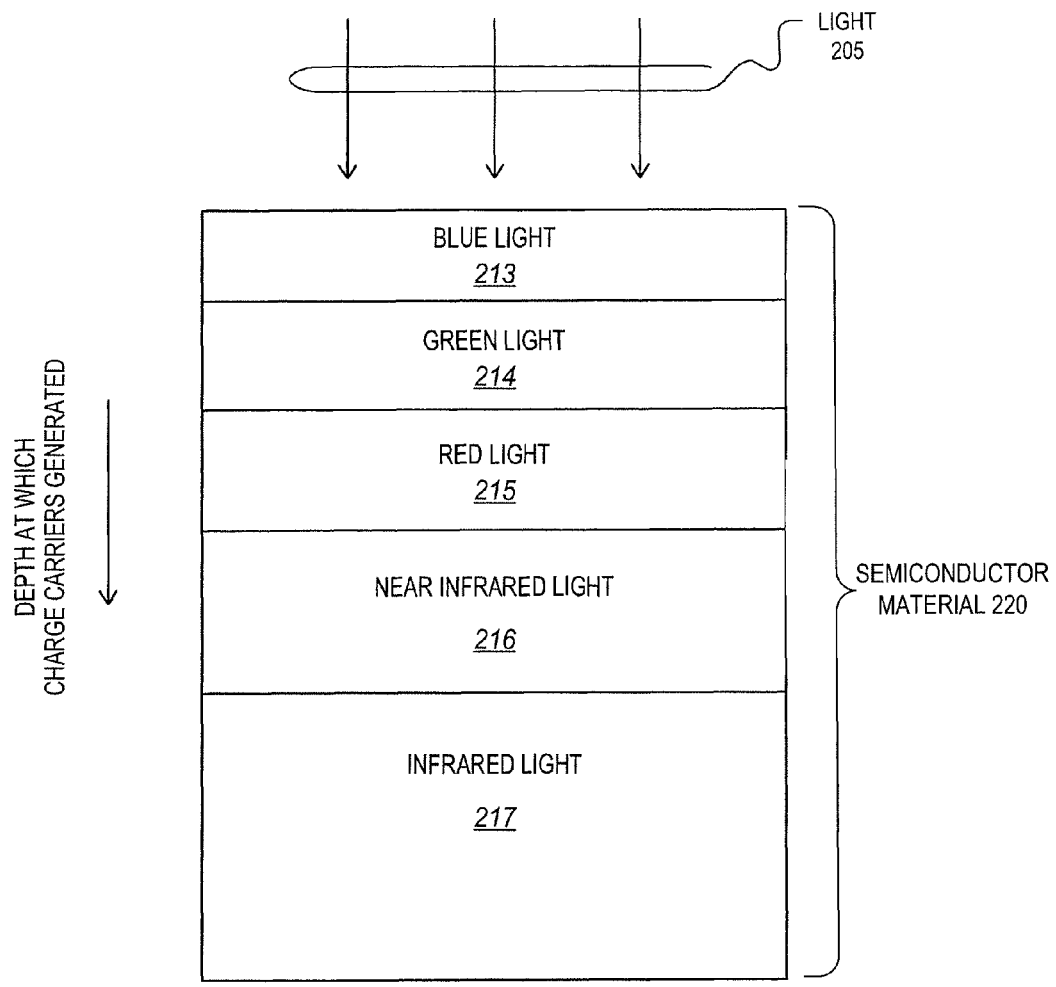
FIG. 2 is a diagram illustrating a known relationship between light wavelengths and the depth at which charge carriers are generated in a semiconductor material as a result of light propagating through the semiconductor material.

FIG. 2 is a diagram illustrating a relationship between light wavelengths and the depth at which charge carriers are generated in a semiconductor material 220, such as for example silicon, as a result of light 205 propagating through semiconductor material 220. For example, in silicon, the depth of penetration prior to photocarrier generation tends to increase with increasing wavelength of the light. Different wavelengths of light have different colors in the visible spectrum. Light of relatively shorter wavelengths, such as blue light 213, green light 214, and red light 215 tends to penetrate less deeply than light of relatively longer wavelengths of light, such as near-infrared light 216 and infrared light 217. Accordingly, longer wavelengths of light, such as near-infrared light and infrared light can penetrate a greater thickness of the semiconductor before the charge carriers are generated.

It is possible for a single photodetector (e.g. photodiode 102) to capture both visible and infrared (including near-infrared) light, but the greater the thickness of the semiconductor material, the greater the challenges are for photodetectors to detect both wavelength ranges. For one thing, using a greater thickness of material for photogeneration of charge carriers may tend to increase the amount of electrical crosstalk. In order to be detected, the electrons (e−) or other charge carriers should move from their point of generation within a given pixel toward the photodetector of that same pixel. However, in electrical crosstalk the electrons (e−) or other charge carriers may migrate or move from their point of generation within a given pixel away from the photodetector of that pixel and into a neighboring pixel. Instead of being detected by the photodetector of the pixel within which the electrons were generated, the electrons may be detected by the photodetector of the neighboring pixel. Such electrical crosstalk may tend to blur images, or otherwise reduce image quality, and is generally undesirable.

Electrons generated farther from the photodetector (e.g., deeper within the material of the substrate) tend to be more prone to such electrical crosstalk as compared to electrons generated closer to the photodetector (e.g., shallower within the material). For example, there may be a farther distance for the electrons to travel and/or there may be less isolation for the photodiodes at increased thicknesses. Consequently, more electrical crosstalk may be encountered when a greater thickness of the material used for the photogeneration of charge carriers is used to detect light of higher wavelengths, such as near-infrared and infrared lights. Increased blooming, reduced mean transfer function, and other factors may also occur when a greater thickness of the material used for the photogeneration of charge carriers is used to detect light of higher wavelengths.

Figure 3:
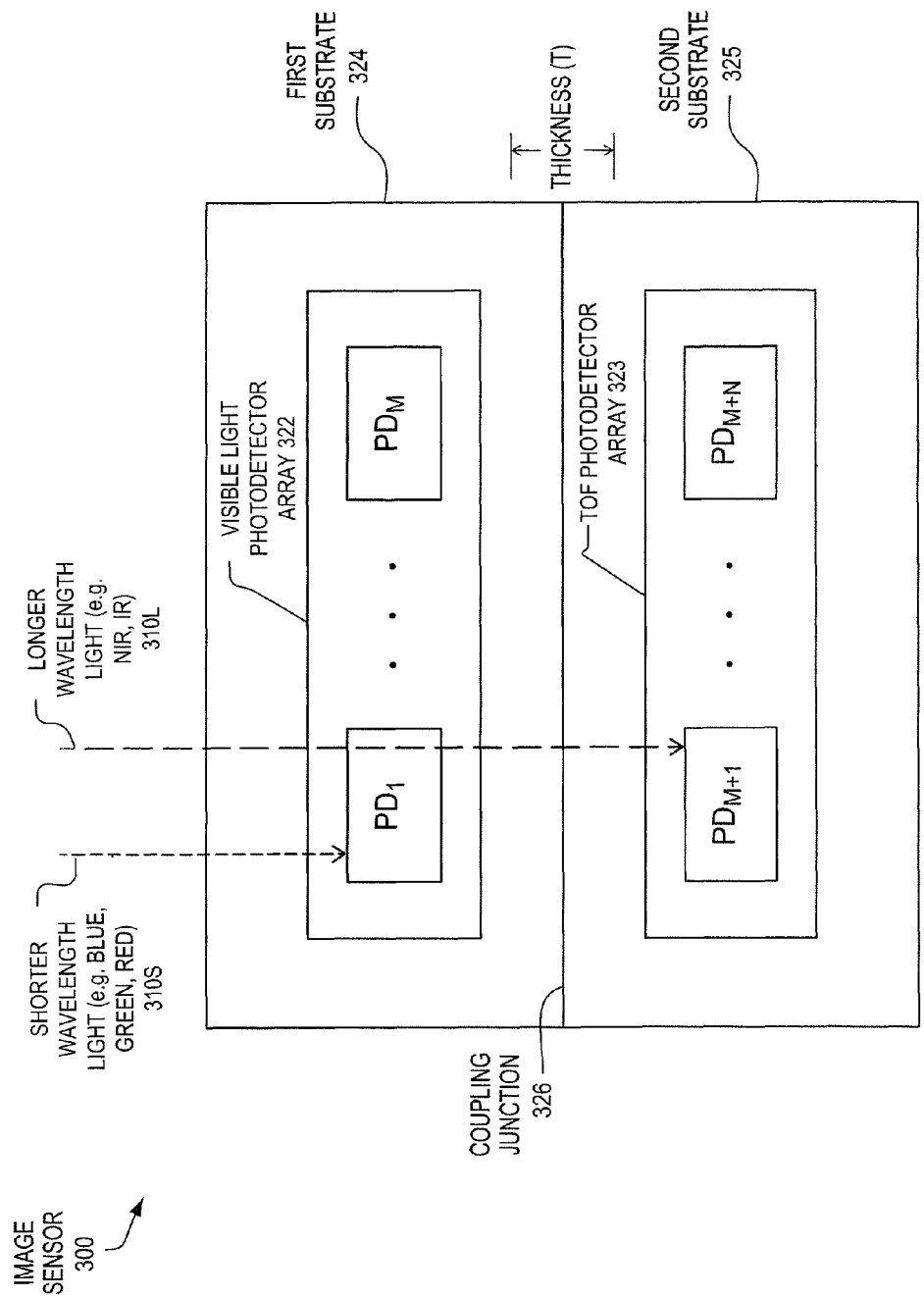
FIG. 3 is a block diagram illustrating a cross-sectional view of an example image sensor capable of capturing 2D and 3D images, in accordance with the teachings of the present invention.

FIG. 3 is a block diagram illustrating a cross-sectional view of an example image sensor 300 capable of capturing 2D and 3D images, in accordance with the teachings of the present invention. Image sensor 300 includes visible light photodetector array 322 disposed in first substrate 324 and TOF photodetector array 323 disposed in second substrate 325. As will be discussed further in connection with FIG. 4 below, TOF photodetector array 323 may receive near-infrared or infrared light in connection with creating a 3D image. In the illustrated example, TOF photodetector array 323 is coupled vertically under visible light photodetector array 322, although it is to be appreciated that image sensor 300 may be used in various different orientations (e.g., an inverted orientation where the image sensor is turned upside-down, or a lateral orientation where the image sensor is turned sideways).

In one example, first substrate 324 and second substrate 325 may comprise silicon or another semiconductor material. First substrate 324 is coupled to second substrate 325 at coupling junction 326. The first substrate 324 and second substrate 325 may be bonded, adhered, or otherwise physically coupled together at coupling junction 326. In such examples, visible light photodetector array 322 and TOF photodetector array 323 are fabricated or formed on separate wafers or other substrates (i.e., as opposed to both being fabricated monolithically on one single substrate), and then the separate wafers or other substrates are coupled together.

A few representative examples of approaches for coupling first substrate 324 and second substrate 325 include, but are not limited to, using an adhesive (e.g., glue, glass frit, or other organic or inorganic adhesive material), reactive bonding, thermo-compression bonding, direct wafer bonding, and using other substrate-substrate bonding (e.g., wafer bonding) approaches. In some examples, an additional material (e.g., an adhesive) may be included between the substrates in order to hold them together, whereas in other examples no such additional material may be used.

Visible light photodetector array 322 includes a first photodetector ($PD_1$) and an Mth photodetector ($PD_M$). TOF photodetector array 323 includes an (M+1)th photodetector ($PD_{M+1}$) and an (M+N)th photodetector ($PD_{M+N}$). M and N are integers of any desired size, which may be equal, but are not required to be equal, meaning the resolution of visible light photodetector array 322 may be equal, smaller or larger in resolution than TOF photodetector array 323. N and M may each be in the millions, in order to provide an image sensor with a resolution in megapixels, although the scope of the invention is not so limited. In the illustrated example, the photodetectors of TOF photodetector array 323 are located under corresponding photodetectors of the visible light photodetector array 322. For example, as illustrated, the (M+1)th photodetector ($PD_{M+1}$) is located under the first photodetector ($PD_1$) and the (M+N)-th photodetector ($PD_{M+N}$) is located under the Mth photodetector ($PD_M$). It is not required that each photodetector of one of the arrays have a one-to-one correspondence with a photodetector in the other array.

Representative examples of suitable photodetectors include, but are not limited to, photodiodes, charge-coupled devices (CCDs), quantum device optical detectors, photogates, phototransistors, and photoconductors. In some examples, the photodetectors may be of the type used in complementary metal-oxide-semiconductor (CMOS) active-pixel sensors (APS). In some examples, the photodetectors may be photodiodes. Representative examples of suitable photodiodes include, but are not limited to, P-N photodiodes, PIN photodiodes, and avalanche photodiodes. In some examples, P-N photodiodes and other types of photodiodes used in CMOS APS are used.

Image sensor 300 includes a thickness (T) of a semiconductor material (e.g. silicon) that is optically coupled between the corresponding pairs of photodetectors of visible light photodetector array 322 and TOF photodetector array 323 (e.g., between $PD_1$ and $PD_{M+1}$). In the illustrated example, the semiconductor material is operable to generate photocarriers, such as photogenerated electrons or holes. Visible light photodetector array 322 is a relatively shallow photodetector array, whereas TOF photodetector array 323 is a relatively deeper photodetector array.

In one example, the thickness (T) of the semiconductor material may be selected to cause the photodetectors of TOF photodetector array 323 to be operable to detect a different portion of the input light than a portion of the input light that the photodetectors of visible light photodetector array 322 are operable to detect. For example, in some examples, the photodetectors of TOF photodetector array 323 may be operable to detect relatively longer wavelength light 310L (without detecting relatively shorter wavelength light 310S), whereas the photodetectors of visible light photodetector array 322 may be operable to detect relatively shorter wavelength light 310S (without detecting relatively longer wavelength light 310L). As shown, the relatively longer wavelength light 310L may penetrate through the thickness (T) of the semiconductor material prior to being detected by the photodetectors of TOF photodetector array 323, but the relatively shorter wavelength light 310S may not penetrate through the thickness (T).

The thickness (T) of the semiconductor material also helps to block, optically filter out, or otherwise prevent the relatively shorter wavelength light 310S from reaching the photodetectors of TOF photodetector array 323. That is, the semiconductor material itself may serve as a color filter based on its wavelength-dependent absorption of light. By way of example, about 1.9 μm of silicon may be sufficient to absorb a majority of visible red (~700-750 nm) and shorter wavelengths of light such that the remaining light may be of a longer wavelength than red light (e.g., near-infrared and infrared), so that these longer wavelengths may be detected by the photodetectors in TOF photodetector array 323. The thickness (T) of the semiconductor material may be provided by first substrate 324, second substrate 325, or a combination thereof. In the illustration, part of the thickness (T) is provided by the first substrate and part of the thickness (T) is provided by the second substrate.

Advantageously, the example embodiment of image sensor 300 provides stacked photodetector arrays. The photodetectors of visible light photodetector array 322 and TOF photodetector array 323 are stacked one over the other, which helps to provide for high pixel densities and avoid needing to provide larger areas to accommodate the photodiodes, which may otherwise be the case if they were provided adjacent one another in the horizontal dimension or plane of the substrate, as opposed to being vertically stacked.

Another potential advantage of the layout of image sensor 300 is that the photodetectors may be operable to detect their respective light wavelengths with reduced levels of crosstalk (e.g., electrical crosstalk and optical crosstalk) and blooming, with increased mean transfer function. The reduced crosstalk may be due to various aspects. For one thing, the electrons or charge carriers generated from the relatively longer wavelength light 310L may be generated relatively closer to the corresponding photodetector or collection region of TOF photodetector array 323, as compared to what would be the case for the prior art shown in FIG. 1, which may result in less opportunity for the charge carriers to travel to an adjacent pixel's photodiode. Moreover, shallow trench isolation (STI) or other isolation (not shown), between the adjacent pixels, may extend across a greater proportion of the vertical thickness of the first and/or second substrates, which may help to reduce both optical and electrical crosstalk. Further, optical crosstalk may be reduced, for example, by reducing the amount of light that may be reflected off of the bottom of the first substrate into an adjacent pixel where it may generate charge carriers.

Figure 4A:
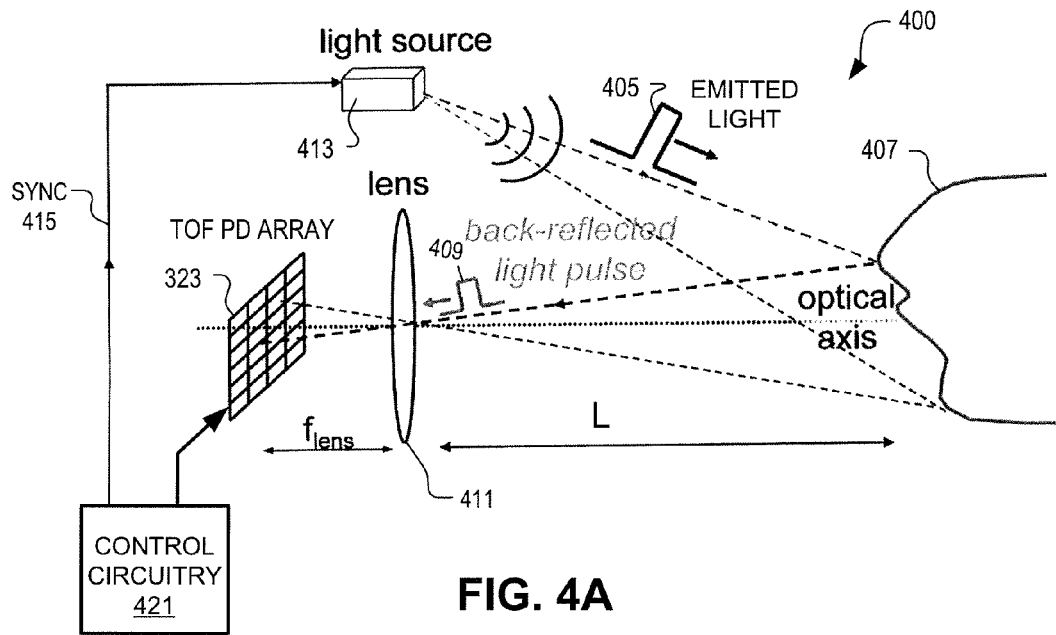
FIG. 4A is a block diagram that shows one example of a time of flight sensing system, in accordance with the teachings of the present invention.
Figure 4B:
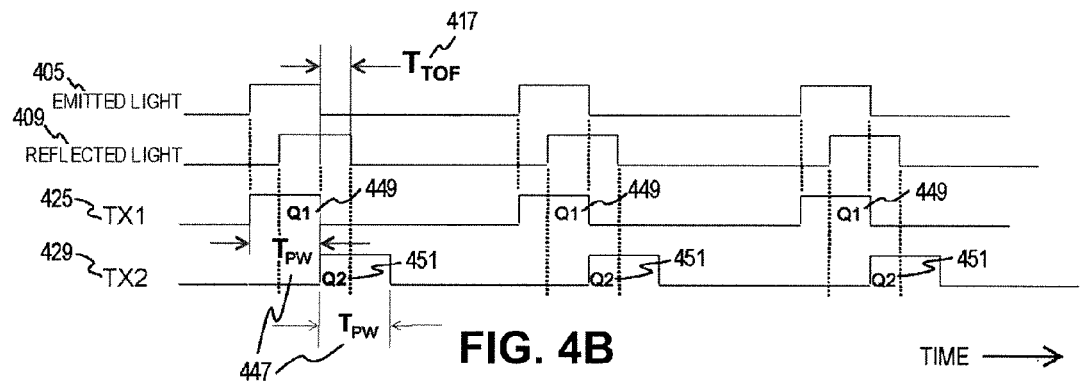
FIG. 4B is a timing diagram that shows an example of light pulses emitted from a light source relative to the receipt of the reflected light pulses in an example time of flight imaging system, in accordance with the teachings of the present invention.
Figure 4C:
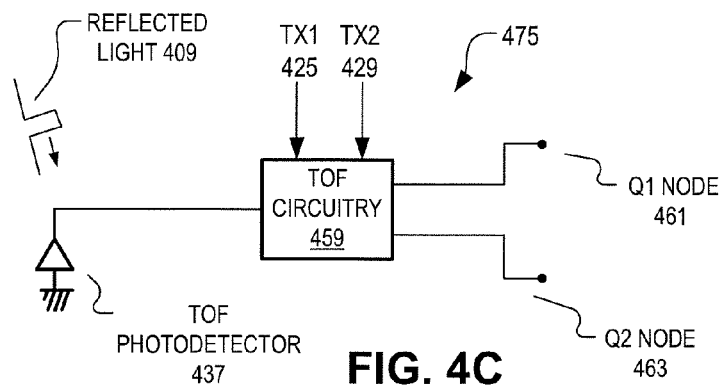
FIG. 4C is a schematic block diagram illustrating one example of time of flight pixel circuitry included in an image sensor, in accordance with the teachings of the present invention.

To further describe the photodetectors in TOF photodetector array 323 and one possible example of how the photodetectors may generate 3D images, attention is directed to FIGS. 4A-4C. FIG. 4A is a block diagram that shows example time of flight sensing system 400, in accordance with the teachings of the present invention. A time of flight sensing system similar to time of flight sensing system 400 may be utilized to assist in generating 3D image data in TOF photodetector array 323.

In the illustrated example, time of flight sensing system 400 includes a light source 413 that emits modulated pulses, which are illustrated as emitted light 405 in FIG. 4A. As shown, emitted light 405 is directed to an object 407. Emitted light 405 may include light pulses of near-infrared or infrared ("IR") light. In one example, emitted light 405 has a wavelength centered at approximately 850 nm. After transmission from light source 413, emitted light 405 is then reflected back from object 407, which is shown as back-reflected light 409 in FIG. 4A. In the illustrated example, reflected light 409 is directed from object 407 through a lens 411 and is then focused onto TOF photodetector array 323. TOF photodetector array 323 may include a plurality of time of flight pixels arranged in a two dimensional array. As will be discussed, in one example, a sync signal 415 is generated by control circuitry 421 and sent to light source 413 to synchronize the light pulses of emitted light 405 with corresponding modulation signals that control the plurality of pixels in TOF photodetector array 323, in accordance with the teachings of the present invention. The sync signal 415 may be a clock signal that directs light source 413 to emit a light pulse or light pulses for a pre-determined duration known to light source 413. In one example, sync signal 415 contains the duration of a light pulse or light pulses emitted by light source 413.

In the example depicted in FIG. 4A, TOF photodetector array 323 is positioned at a focal length $f_{lens}$ from lens 411. As shown in the example, light source 413 and lens 411 are positioned a distance L from the object. Lens 411 may be a microlens among a plurality of microlenses disposed over TOF photodetector array 323. It is appreciated that FIG. 4A is not illustrated to scale and that in one example, the focal length $f_{lens}$ is substantially less than the distance L between lens 411 and object 407. Therefore, it is appreciated that for the purposes of this disclosure, that the distance L and the distance L+focal length $f_{lens}$ are substantially equal for purposes of time of flight measurements in accordance with the teachings of the present invention.

FIG. 4B is a timing diagram that shows an example of light pulses of emitted light 405 emitted from light source 413 relative to the receipt of pulsed of reflected light 409 in an example time of flight imaging system, in accordance with the teachings of the present invention. FIG. 4B also shows switching modulation signals TX1 425 and TX2 429 relative to the modulated pulses of emitted light 405 and reflected light 409. Emitted light 405 represents the modulated light pulses that are emitted from light source 413 to object 407. Reflected light 409 represents the reflected light pulses that are back-reflected from object 407 and received by TOF photodetector array 323. In one example, light source 413 emits the light pulses of emitted light 405 with a duty cycle of less than 10%. In one example, the pulse widths $T_{PW}$ 447 of the light pulses have a duration in the range of 20 nanoseconds to 100 nanoseconds. It is appreciated that other duty cycles and pulse widths for emitted light 405 may also be utilized, in accordance with the teachings of the present invention. As shown, a light pulse of emitted light 405 and reflected light 409 has the same pulse width $T_{PW}$ 447 as reflected light 409.

As shown in the depicted example, due to the amount of time that it takes for the light pulses to travel the distance L from light source 413 to object 407, and then the additional time it takes for the reflected light pulses to travel the distance L back from object 407 to TOF photodetector array 323, there is a delay time of $T_{TOF}$ 417 between the emission of a light pulse of emitted light 405 and the receipt of that light pulse in reflected light 409. The time difference $T_{TOF}$ 417 between emitted light 405 and reflected light 409 represents the time of flight for the light pulses to make the round trip between light source 413 and object 407. Once the time of flight $T_{TOF}$ 417 is known, the distance L from light source 413 to object 407 can be determined using the following relationships in Equations (1) and (2) below:

$$T_{TOF} = \frac{2L}{c} \quad (1)$$

$$L = \frac{T_{TOF} \times c}{2} \quad (2)$$

where c is the speed of light, which is approximately equal to $3 \times 10^8$ m/s, and $T_{TOF}$ is the amount of time that it takes for the light pulse to travel to and from the object as shown in FIG. 4A.

FIG. 4C is a schematic block diagram illustrating one example of time of flight pixel circuitry 475 included in an image sensor, in accordance with the teachings of the present invention. Time of flight pixel circuitry 475 may be implemented in each pixel of TOF photodetector array 323. The time of flight pixel circuitry 475 illustrated in FIG. 4C includes TOF photodetector 437, TOF circuitry 459, Q1 node 461, and Q2 node 463. It is appreciated that time of flight pixel circuitry 475 can be implemented in one of the plurality of pixels included in the example TOF photodetector array 323 illustrated in FIG. 4A. TOF photodetector 437 accumulates charge in response to light incident on TOF photodetector 437. In one example, the light incident upon TOF photodetector 437 includes reflected light 409, as discussed above with respect to FIGS. 4A and 4B. In one example, reflected light 409 is near-infrared light. Calibration processes may be used to calculate the difference between image signals from TOF photodetector 437 that are generated by ambient light (that reaches TOF photodetector 437) and image signals from TOF photodetector 437 that are generated by reflected light 409.

In the illustrated example, TOF photodetector 437 is coupled to TOF circuitry 459, which is coupled to Q1 node 461 and coupled to Q2 node 463. Also illustrated, switching modulation signals TX1 425 and TX2 429 are inputs to TOF circuitry 459. The image charge accumulated in TOF photodetector 437 from a single light pulse (e.g. reflected light 409) is the sum of Q1 449 and Q2 451 illustrated in FIG. 4B in connection with switching modulation signals TX1 425 and TX2 429. TOF circuitry 459 receives first switching modulation signal TX1 425 and selectively transfers the image charge accumulated in TOF photodetector 437 while TX1 425 is activated (Q1 449) to Q1 node 461. TOF circuitry 459 also receives second switching modulation signal TX2 429 and selectively transfers image charge accumulated in TOF photodetector 437 while TX2 429 is activated (Q2 451) to Q2 node 463. In some examples, Q1 node 461 and Q2 node 463 store multiple Q1 449 and Q2 451 from multiple accumulation/integration periods of reflected light 409 incident on TOF photodetector 437. In these examples, the total Q1 449 stored in Q1 node 461 over multiple accumulation/integration periods may be referred to as ΣQ1 and the total Q2 451 stored in Q2 node 463 over multiple accumulation/integration periods may be referred to as ΣQ2.

It is appreciated that first switching modulation signal TX1 425 is activated for the same duration ($T_{PW}$ 447) as the light pulse that makes up emitted light 405 and the same duration ($T_{PW}$ 447) that second switching modulation signal TX2 429 is activated. Given the relationship between first modulation signal TX1 425 and emitted light 405, first modulation signal TX1 425 may be referred to as "in-phase" with emitted light 405 and Q1 449 is generated by the "in-phase" portion of reflected light 409. Consequently, second modulation signal TX2 429 may be referred to as "out-of-phase" with emitted light 405 and Q2 451 is generated by the "out-of-phase" portion of reflected light 409.

In one example, the time of flight $T_{TOF}$ 417 that it takes for the light emitted from light source 413 to travel to and from object 407 can be determined according to the following relationship in Equation (3) below:

$$T_{TOF} = T_{PW}\left(\frac{\sum Q2}{\sum(Q1+Q2)}\right) \quad (3)$$

where $T_{TOF}$ represents the time of flight $T_{TOF}$ 417, $T_{PW}$ represents the pulse width $T_{PW}$ 447, ΣQ2 represents the total amount of charge Q2 accumulated in Q2 node 463 and Σ(Q1+Q2) represents the sum of the total amount of charge accumulated in Q1 node 461 and Q2 node 463. Once the time of flight $T_{TOF}$ 417 is determined, the $T_{TOF}$ result can then be substituted in to Equation (2) summarized above in order to determine the distance L in accordance with the teachings of the present invention.

Figure 5:
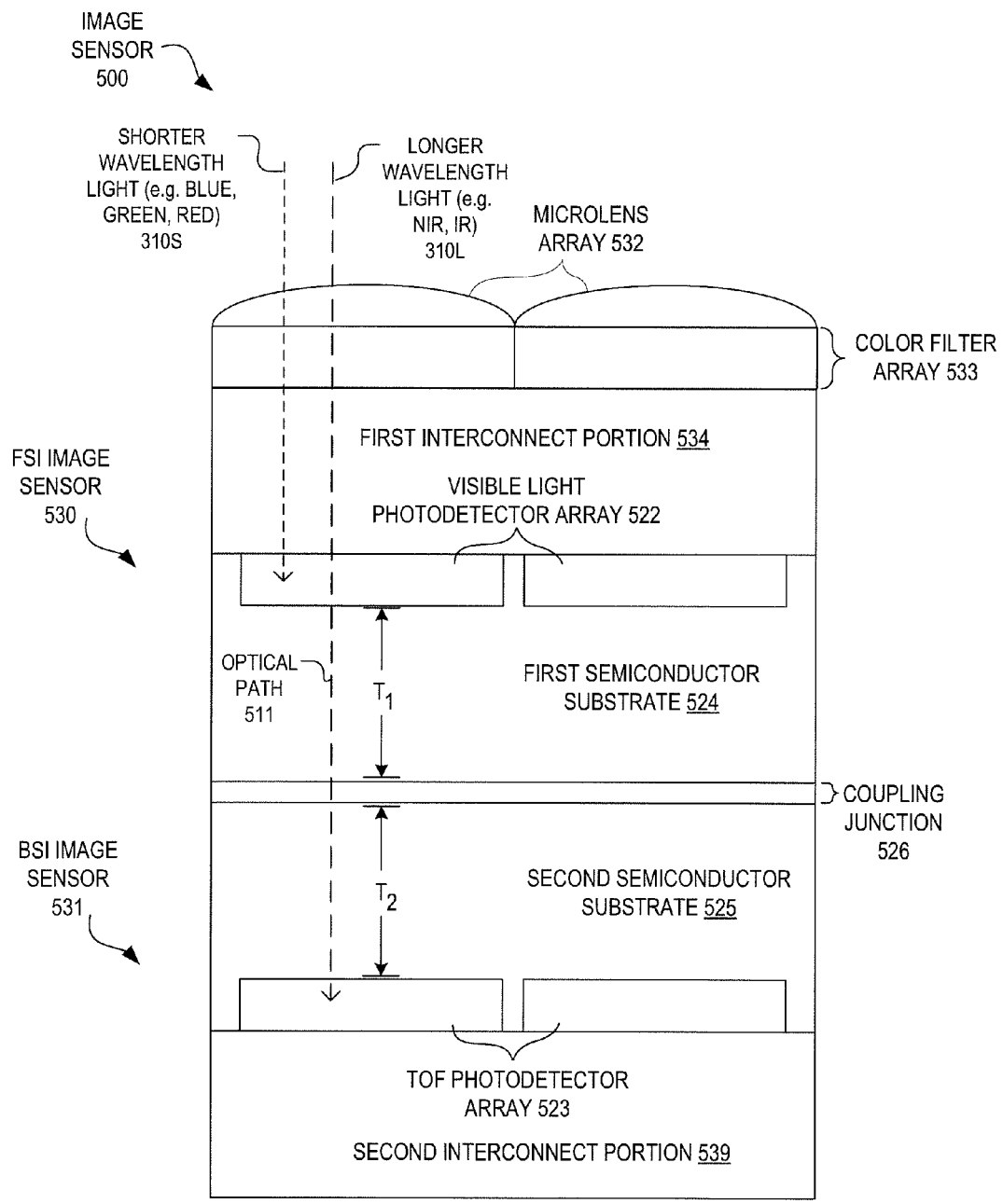
FIG. 5 is a block diagram illustrating a cross-sectional view of an example image sensor including a frontside image sensor coupled to a backside image sensor, in accordance with the teachings of the present invention.

FIG. 5 is a block diagram illustrating a cross-sectional view of an example image sensor 500 including a frontside image sensor 530 coupled to a backside image sensor 531, in accordance with the teachings of the present invention. For simplicity, two pixels are shown, although typically the image sensor may include a two dimensional array with a multitude of pixels. FSI image sensor 530 includes a microlens array 532 operable to receive and focus incoming light 310S and 310L (e.g., backscattered light from an object being imaged).

A color filter array 533 of FSI image sensor 530 is optically coupled to receive the focused light from microlens array 532 and operable to filter the light. A first interconnect portion 534 of FSI image sensor 530 is optically coupled to receive the light from color filter array 533. First interconnect portion 534 may include interconnects (not shown) such as lines, wires, traces, vias, etc. disposed within a dielectric material (not shown). The interconnects may be arranged to include openings to the photodetectors through which light may pass. The dielectric material may be operable to transmit the light.

FSI image sensor 530 also includes first semiconductor substrate 524, which is optically coupled to receive the light from the first interconnect portion 534. A visible light photodetector array 522 is disposed in a frontside portion of first semiconductor substrate 524. Visible light photodetector array 522 is operable to detect shorter wavelength light 310S (e.g. visible light). First semiconductor substrate 524 also includes a first thickness (T1) of a semiconductor material coupled between visible light photodetector array 522 and coupling junction 526. In some examples, a backside (facing coupling junction 526) of FSI image sensor 530 is a thinned backside that has been thinned by an amount (e.g., from around 200-500 µm initially to around 1-20 µm) appropriate to provide the desired filtering characteristics to filter light traveling to a TOF photodetector array 523.

BSI image sensor 531 is coupled under FSI image sensor 530 and coupling junction 526. BSI image sensor 531 includes TOF photodetector array 523 disposed in second semiconductor substrate 525. Second semiconductor substrate 525 includes a second thickness (T2) of a semiconductor material coupled between TOF photodetector array 523 and coupling junction 526. TOF photodetector array 523 is operable to detect longer wavelength light 310L. BSI image sensor 531 also includes a second interconnect portion 539 coupled underneath TOF photodetector array 523.

Second semiconductor substrate 525 is optically coupled to receive longer wavelength light 310L. Longer wavelength light 310L may include reflected light 409 and may include ambient light. Reflected light 409 may be directed to a pixel of TOF photodetector array 523 along an example optical path 511. As shown, light (e.g. reflected light 409) is directed along optical path 511 through a microlens of microlens array 532 and through a color filter of color filter array 533. The light along optical path 511 continues through first interconnect portion 534 and travels through a photodetector of visible light photodetector array 522. The light along optical path 511 may continue through the semiconductor material and generate charge carriers in a photodetector of TOF photodetector array 523, assuming the light has wavelength sufficiently long to avoid being filtered out by the semiconductor material.

The location of visible light photodetector array 522 in first semiconductor substrate 524 and the depth of first semiconductor substrate 524 may be engineered or tuned to cause visible light photodetector array 522 to receive charge carriers generated by a target light wavelength (e.g. 310S). Additionally, the location of TOF photodetector array 523 in second semiconductor substrate 525 and the depth of second semiconductor substrate 525 combined with the depth of first semiconductor substrate 524 may be engineered or tuned to cause target TOF photodetector array 523 to receive charge carriers generated by a target light wavelength (e.g. 310L). In one example, the target wavelength of light for visible light photodetector array 522 to detect is visible light. In one example, first semiconductor substrate 524 is thinned to 1.9 µm. In one example, the target wavelength of light for TOF photodetector array 523 is 850 nm and the total semiconductor thickness encountered by light in optical path 511 is appropriately thinned to filter out light with wavelengths shorter than ~850 nm from generating charge carriers detectable by TOF photodetector array 523.

It is appreciated that even though visible light photodetector array 522 is disposed in FSI image sensor 530 and TOF photodetector array 523 is disposed in BSI image sensor in the illustrated embodiment, other configurations are possible. In one example, visible light photodetector array 522 could be disposed in a BSI image sensor and TOF photodetector array 523 could be disposed in a FSI image sensor, if the semiconductor substrates of each image sensor (BSI and FSI) were appropriately thinned. In this example, the interconnect layers of the respective image sensors may need rearranging.

Figure 6:
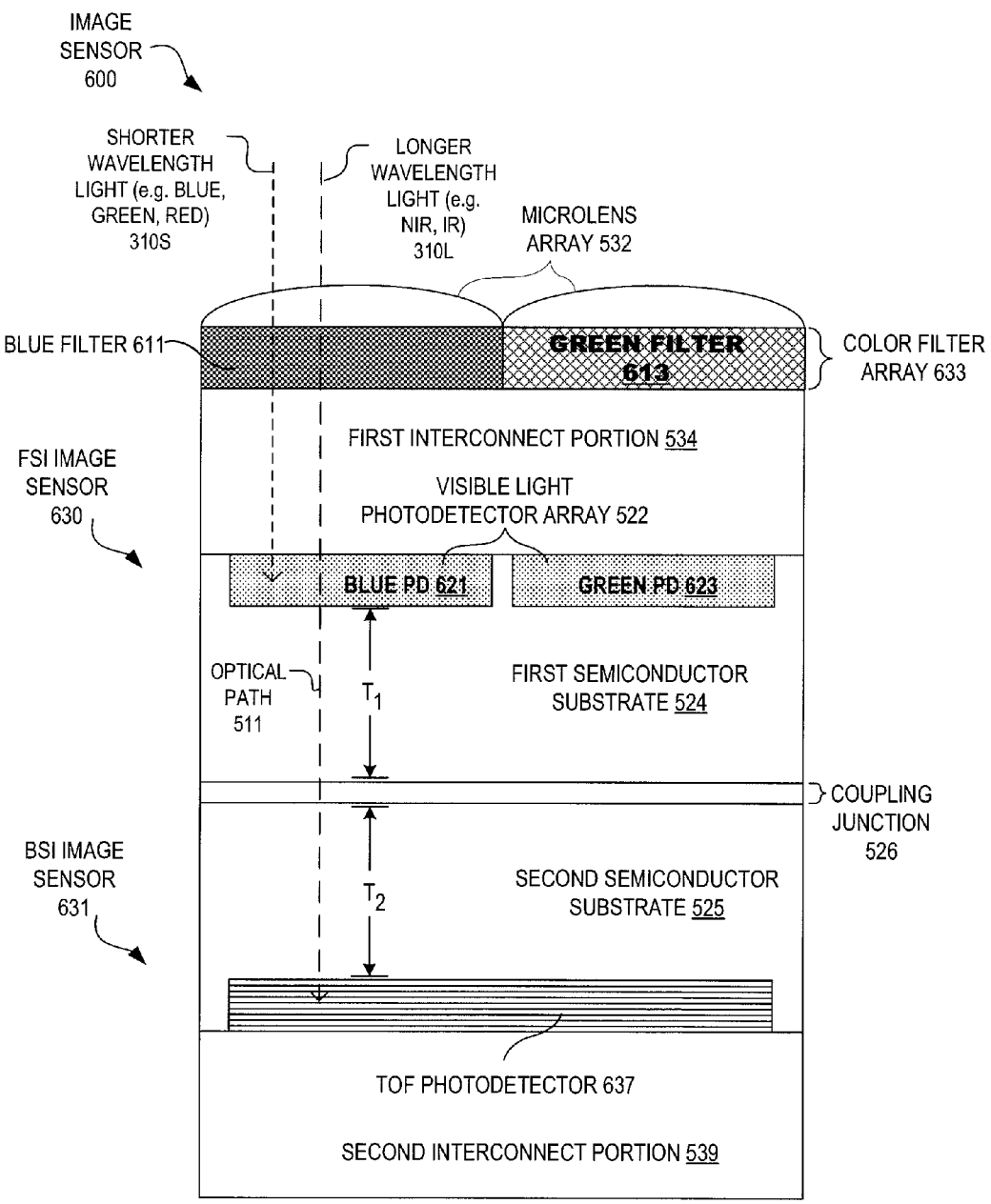
FIG. 6 is a block diagram illustrating a cross-sectional view of an example image sensor including different color filters, in accordance with the teachings of the present invention.

FIG. 6 is a block diagram illustrating a cross-sectional view of an example image sensor 600 including different color filters, in accordance with the teachings of the present invention. Image sensor 600 is configured differently than image sensor 500. Image sensor 600 includes blue filter 611 and green filter 613 in color filter array 633. Image sensor 600 also includes blue photodetector ("PD") 621, which is optically coupled to detect the blue light passed by blue filter 611, and green PD 623, which is optically coupled to detect the green light passed by green filter 613. Image sensor 600 further includes a TOF photodetector 637 which may be a photodetector in TOF photodetector array 323. TOF photodetector 637 is disposed in second semiconductor substrate 525.

Figure 7:
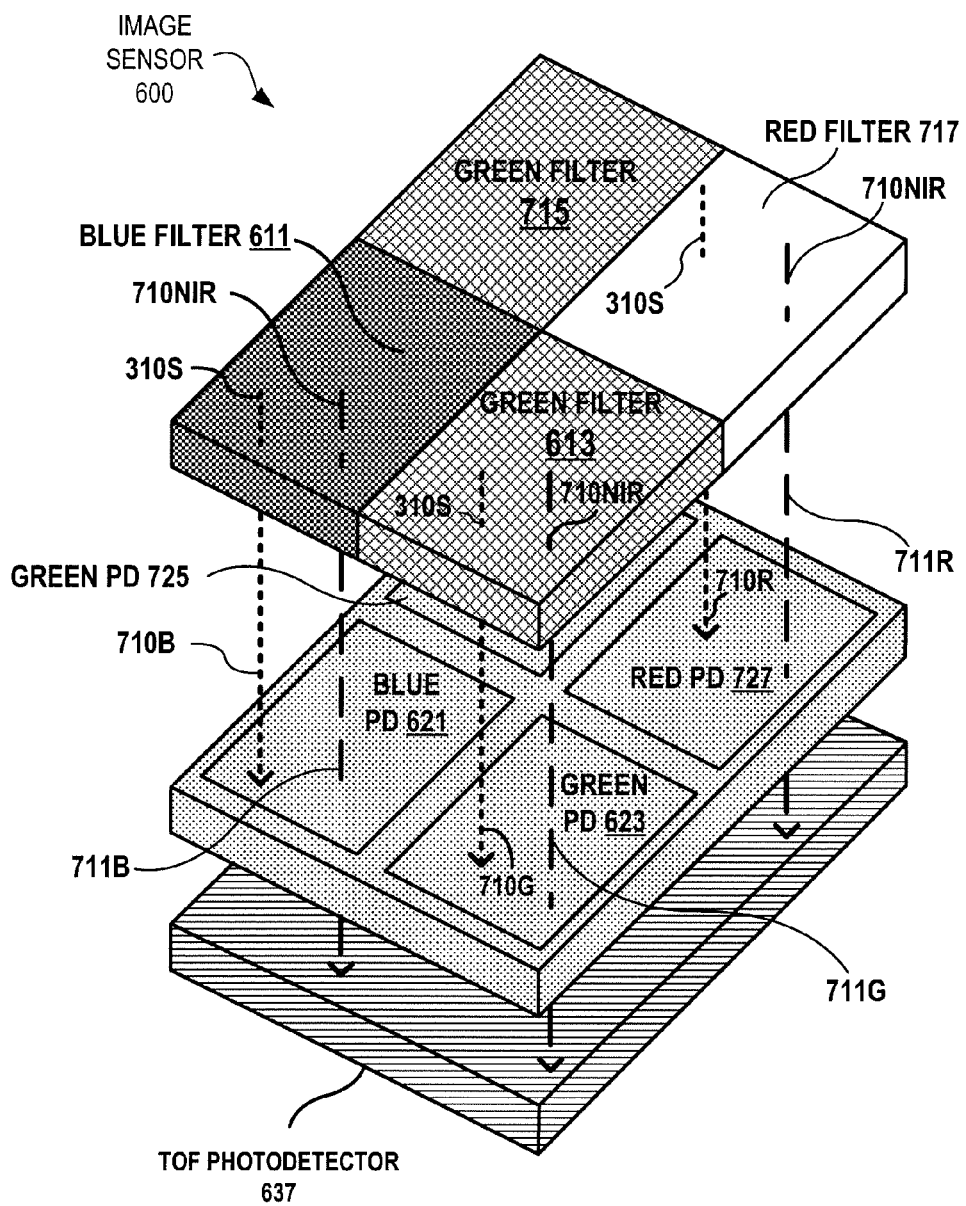
FIG. 7 is a perspective view of selected components of an example image sensor and optical paths of light received by the example image sensor, in accordance with the teachings of the present invention.

FIG. 7 is a different view of image sensor 600. FIG. 7 is a perspective view of selected components of example image sensor 600 and optical paths of light received by example image sensor 600, in accordance with the teachings of the present invention. A pixel of image sensor 600 may include a Red-Green-Green-Blue ("RGGB") color filter configuration, as illustrated. The RGGB pattern may be repeated for every pixel in visible light photodetector array 522. Other color filter configurations are possible. Blue filter 611 primarily passes blue light 710B that may have wavelengths centered at approximately 450-475 nm. Green filter 613 and green filter 715 primarily pass green light 710G that may have wavelengths centered at approximately 495-570 nm. Red filter 717 primarily passes red light 710R that may have wavelengths centered at approximately 620-750 nm.

Figure 8:
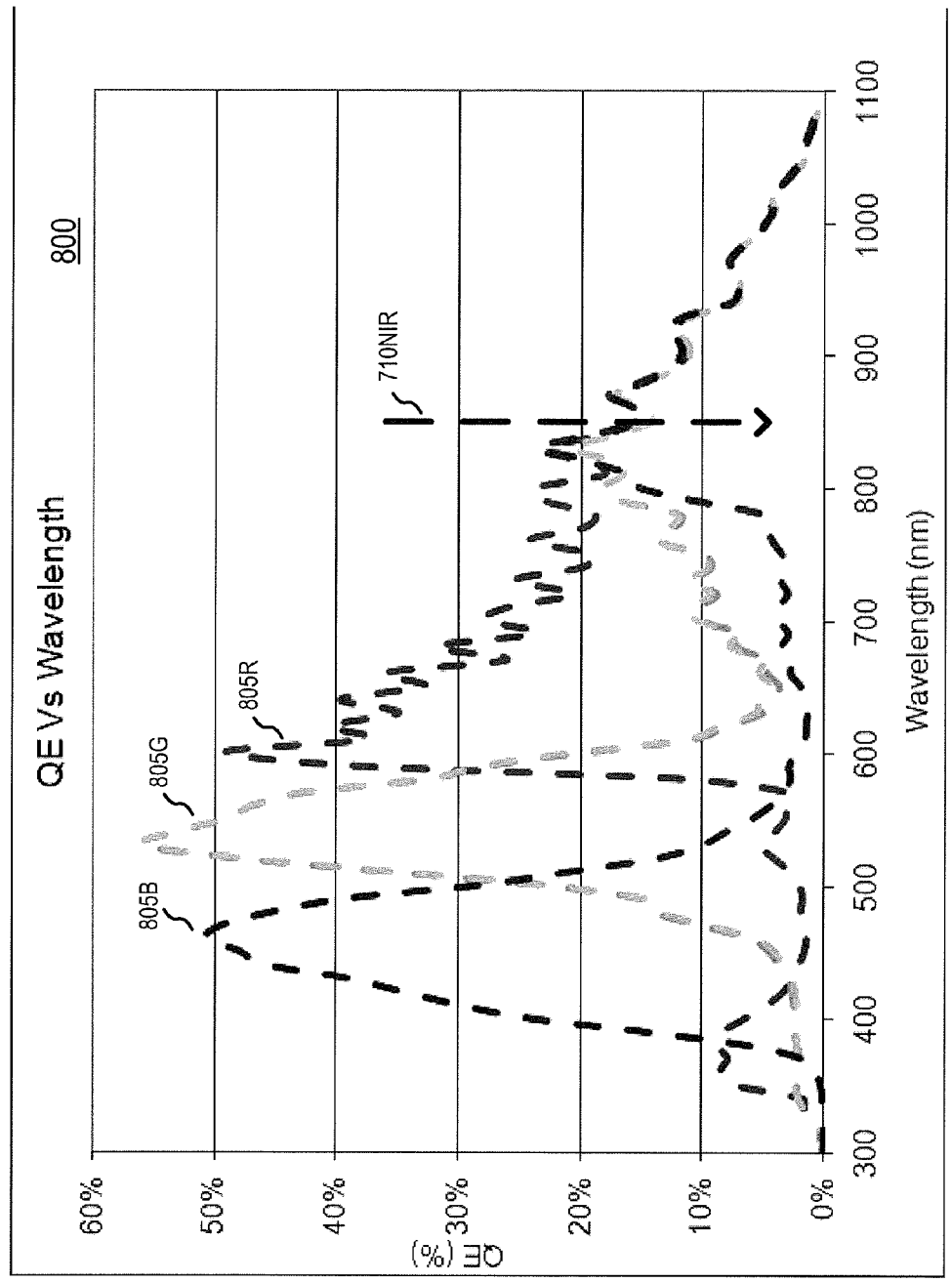
FIG. 8 is a chart showing example quantum efficiencies of a typical silicon image sensor with respect to wavelength when red, green, and blue filters are disposed over the silicon image sensor, in accordance with the teachings of the present invention.

Blue filter 611, green filters 613 and 715, and red filter 717 also pass at least a portion of near-infrared light 710NIR. FIG. 8 is a chart 800 showing example quantum efficiencies of a typical silicon image sensor with respect to wavelength when red, green, and blue filters are disposed over the silicon image sensor, respectively. FIG. 8 includes blue quantum efficiency line 805B that illustrates the approximate quantum efficiency of blue filter 611 in relation to wavelength. Green quantum efficiency line 805G illustrates the approximate quantum efficiency of green filters 613 and 715 in relation to wavelength. Red quantum efficiency line 805R illustrates the approximate quantum efficiency characteristics of red filter 717 in relation to wavelength. Quantum efficiency is a measurement of the percentage of photons (for a certain wavelength) that are converted to charge carriers when the photons pass through a substrate (e.g. silicon).

The quantum efficiencies of filters over a wavelength spectrum corresponds to the transmission of filters over wavelengths. Thus, chart 800 is an indicator that the optical transmission characteristic of each of the filters includes a significant amount of light transmission between approximately 800 nm and 900 nm. Therefore, this relatively narrow (~100 nm) transmission spike inherent in the optical characteristics of each filter can be exploited to allow higher wavelength light (e.g. 310L) to reach TOF photodetector array 523 or TOF photodetector 637, in accordance with the teachings of this disclosure. As a result of this optical characteristic found in some color filters, light source 413 may emit light between approximately 800 nm and 900 nm to assist 3D imaging in TOF photodetector array 323 or 523. Accordingly, Chart 800 shows near-infrared light 710NIR as a dashed arrow that can penetrate each of the color filters between 800 nm and 900 nm, due to the transmission characteristics at that wavelength.

Referring back to FIG. 7, blue filter 611, green filters 613 and 715, and red filter 717 are each in color filter array 633 and each pass their respective light color (710B, 710G, 710R) in addition to each passing at least a portion of near-infrared light 710NIR, when the near-infrared light 710NIR has a wavelength that can be passed by the filters (e.g. ~800 nm-900 nm). FIG. 7 shows that image sensor 600 includes green PD 725 optically coupled to detect the green light passed by green filter 715 and red PD 727 is optically coupled to detect the red light passed by red filter 717.

Additionally, near-infrared light 710NIR passes through the respective color filters and photodetectors and continues along an optical path toward TOF photodetector 637. For example, near-infrared light 710NIR may be focused by a microlens in microlens array 532 before encountering blue filter 611 along optical path 711B. Near-infrared light 710NIR along optical path 711B continues through first interconnect portion 534 and travels through blue PD 621 of visible light photodetector array 522. Near-infrared light 710NIR along optical path 711B may continue through the semiconductor material and generates charge carriers in TOF photodetector 637. As illustrated, near-infrared light 710NIR may take similar optical paths 711G and 711R in connection with the different respective color filters and photodetectors.

It is appreciated that FIGS. 6 and 7 illustrate TOF photodetector 637 as a single photodetector that receives light through multiple visible light photodectors and color filters. For example, TOF photodetector 637 may receive charge carriers generated by reflected light 409 where the reflected light is directed along optical path 711B. TOF photodetector 637 may also receive different charge carriers generated by reflected light 409 where the reflected light is directed along optical path 711G and/or 711R. In one example, TOF photodetector array 523 is a lower resolution than visible light photodetector array 522 and a single TOF photodetector receives charge carriers from reflected light 409 that travels through sixteen different color filters and sixteen different photodetectors included in visible light photodetector array 522. Other examples with different numbers of color filters and photodetectors corresponding to a single TOF photodetector are possible. Alternatively, in one example, TOF photodetector array 523 has a higher resolution than visible light photodetector array 522.

Figure 9:
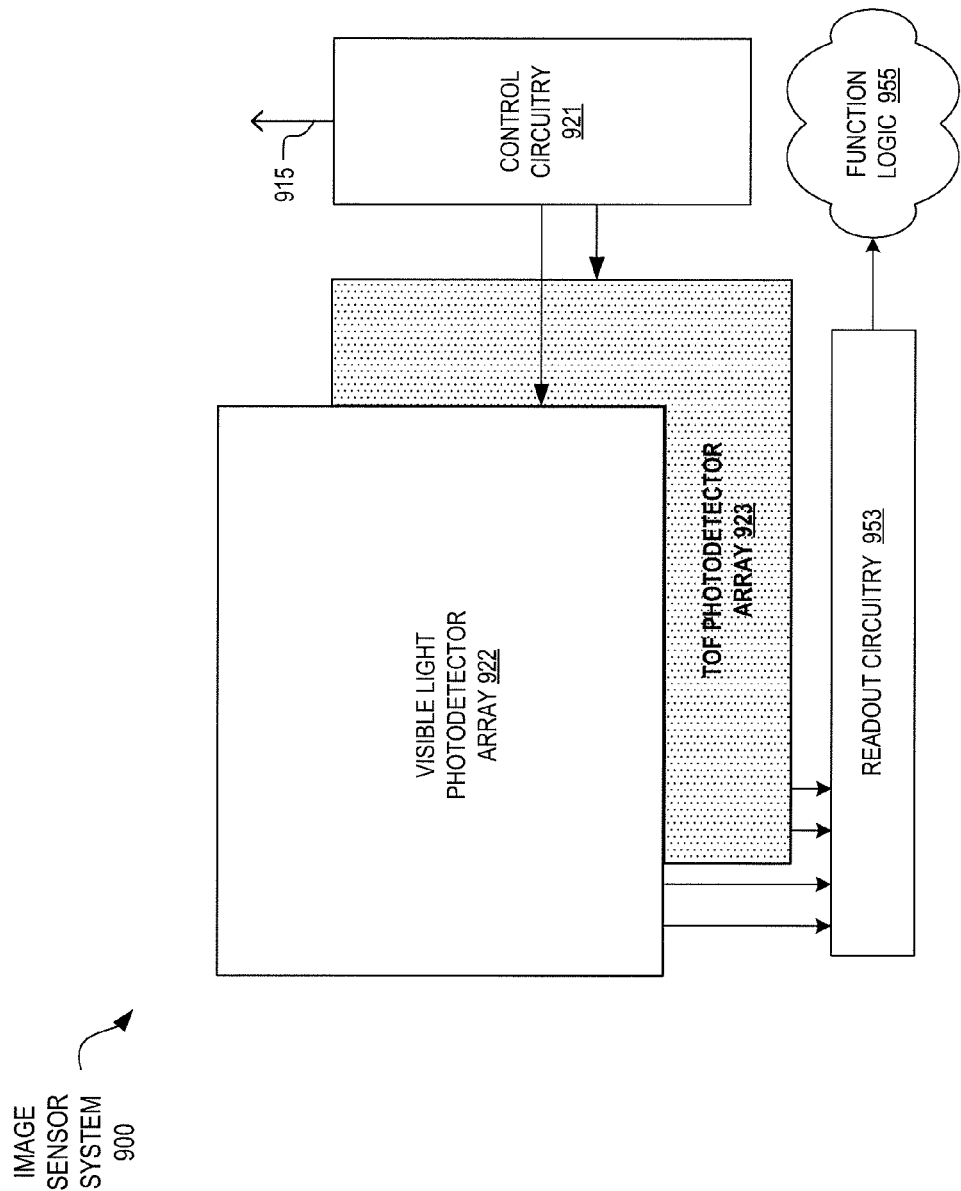
FIG. 9 is a block diagram illustrating one example of an image sensor system, in accordance with the teachings of the present invention.

FIG. 9 is a block diagram illustrating one example of an image sensor system 900, in accordance with the teachings of the present invention. The illustrated example of image sensor system 900 includes a visible light photodetector array 922, a TOF photodetector array 923, readout circuitry 953, function logic 955, and control circuitry 921. The photodetector arrays may each include a two-dimensional array of pixels (e.g., each optionally having millions of pixels), which may be arranged into rows and columns. Visible light photodetector array 922 may correspond with FSI image sensor 530 and be used for 2D imaging. TOF photodetector array 923 may correspond with BSI image sensor 531 and be used for 3D imaging.

During image acquisition, each of the photodetectors or pixels of the photodetector arrays may acquire image data (e.g., an image charge). After each photodetector or pixel has acquired its image data or image charge, the image data may be readout by readout circuitry 953 and transferred to function logic 955. The readout circuitry may readout the image data for visible light photodetector array 922 and TOF photodetector array 923 in a coordinated fashion. In various aspects, the image data may be read out with duplicate traditional readout circuits and the streams may be combined off chip. The readouts of the image data for the two photodetector arrays may be coordinated on chip. The image data may be combined or coordinated prior to transmission of the image data off chip. Image data may be read out by column readout, serial readout, full parallel readout of all pixels concurrently, etc.

In one aspect, the function logic 955 may merely store the image data, or in another aspect, the function logic may manipulate the image data using various ways known in the arts (e.g., crop, rotate, remove red eye, adjust brightness, adjust contrast, etc.). Function logic 955 may be implemented in hardware, software, firmware, or a combination. Control circuitry 921 is coupled to each of the photodetector arrays to control operational characteristics of the photodetector arrays. For example, the control circuitry may generate a shutter signal for controlling image acquisition. The shutter signal may be a global shutter signal or a rolling shutter signal. It is appreciated that control circuitry 921 may correspond to control circuitry 421 and sync signal 915 may correspond to sync signal 415. In one example, control circuitry 921 coordinates the transmission of emitted light 405 and switching modulation signals TX1 425 and TX2 429.

In one embodiment, each image sensor (FSI and BSI) has its own separate readout circuitry 953, control circuitry 921, and functional logic 955 disposed on the same semiconductor substrate as the respective array of the image sensor. Each image sensor may have separate inputs and outputs that correspond to separate circuitry that drives each image sensor separately. In one embodiment, one image sensor has readout circuitry 953, control circuitry 921 and functional logic 955 disposed on the same semiconductor substrate as the respective array on the image sensor. In this embodiment, the readout circuitry 953, control circuitry 921, and functional logic 955 on-board the image sensor may drive both of the stacked image sensors.

Various operations and methods have been described. Some of the methods have been described in a basic form, but operations may optionally be added to and/or removed from the methods. Alternate embodiments may optionally perform the operations in different order, combine certain operations or overlap certain operations described in the disclosure.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible non-transitory machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An apparatus comprising:
    a first photodetector array including visible light photodetectors disposed in semiconductor material to detect visible light included in light incident upon the semiconductor material, wherein the first photodetector array is a frontside illuminated ("FSI") photodetector array; and
    a second photodetector array including time of flight ("TOF") photodetectors disposed in the semiconductor material to capture TOF data from reflected light reflected from an object included in the light incident upon the semiconductor material, wherein the reflected light reflected from the object is directed to the TOF photodetectors along an optical path through the visible light photodetectors and through a thickness of the semiconductor material, and wherein the visible light photodetectors of the first photodetector array are disposed in the semiconductor material along the optical path between the object and the TOF photodetectors of the second photodetector array, the second photodetector array being a backside illuminated ("BSI") photodetector array.

2. The apparatus of claim 1, wherein the thickness of the semiconductor material causes the TOF photodetectors to receive charge carriers generated by the reflected light, and wherein the thickness of the semiconductor material causes charge carriers generated by the visible light to be received by the visible light photodetectors.

3. The apparatus of claim 1, further comprising a microlens array and a color filter array disposed on the semiconductor material along the optical path, wherein the the first photodetector array is optically coupled to receive the visible light focused from the microlens array and the color filter array, wherein the color filter array includes a first color filter that primarily passes a first color of the visible light and a second color filter that primarily passes a second color of the visible light, and wherein the first and second color filter also pass the reflected light when the reflected light has a longer wavelength than the visible light.

4. The apparatus of claim 3, wherein the reflected light has a wavelength of approximately 800 - 900 nm.

5. The apparatus of claim 1, wherein the visible light photodetectors include:
    a first photodetector disposed in a first pixel configured to measure red light;
    a second photodetector disposed in a second pixel configured to measure green light; and
    a third photodetector disposed in a third pixel configured to measure blue light, wherein the first, second, and third photodetector are a photodetector set that corresponds with, and is disposed above, a first TOF photodetector of the TOF photodetectors.

6. The apparatus of claim 1, wherein the semiconductor material comprises a silicon material.

7. The apparatus of claim 1, wherein the first photodetector array has a first resolution and the second photodetector array has a second resolution different from the first resolution.

8. The apparatus of claim 1, further comprising a light source for emitting pulsed light, wherein the reflected light is the pulsed light from the light source.

9. The apparatus of claim 8, wherein a first TOF photodetector of the TOF photodetectors is coupled to TOF circuitry and the TOF circuitry is coupled to a first node and a second node, and wherein the first node stores a first charge generated by an in-phase portion of the reflected light incident on the first TOF photodetector, and further wherein the second node stores a second charge generated by an out-of-phase portion of the reflected light incident on the first TOF photodetector, the in-phase portion of the reflected light being incident within an on-time of a light pulse among the pulsed light emitted.

10. The apparatus of claim 8, further comprising control circuitry coupled to the second photodetector array, wherein the control circuitry is configured to send a control signal to the light source to cause the light source to emit the pulsed light in coordination with capturing the TOF data from the second photodetector array.

11. A method of capturing a two-dimensional image and a three-dimensional image simultaneously, the method comprising:
    emitting light pulses from a light source that become reflected light after reflecting off of an object;
    receiving first charge carriers generated by visible light in a first visible light photodetector disposed in semiconductor material, wherein the visible light is directed along a first optical path through a first microlens and a first color filter disposed on the semiconductor material to the first visible light photodetector; and
    receiving second charge carriers generated by the reflected light in a time of flight ("TOF") photodetector, wherein the reflected light is directed along the first optical path through the first microlens, the first color filter, the first visible light photodetector, and a thickness of the semiconductor material disposed between the first visible light photodetector and the TOF photodetector,
    wherein a first TOF photodetector of the TOF photodetectors is coupled to TOF circuitry and the TOF circuitry is coupled to a first node and a second node, and wherein the first node receives an in-phase portion of the second charge carriers generated by the reflected light and the second node receives an out-of-phase portion of the second charge carriers generated by the reflected light, the in-phase portion of the reflected light being incident on the first TOF photodetector within an on-time of a light pulse among the pulsed light emitted.

12. The method of claim 11, further comprising receiving third charge carriers generated by the reflected light in the TOF photodetector, wherein the reflected light is directed along a second optical path through a second microlens and a second color filter disposed on the semiconductor material, and through a second visible light photodetector disposed in the semiconductor material, wherein the second microlens and the second color filter are disposed along the second optical path between the object and the second visible light photodetector.

13. The method of claim 12, further comprising receiving fourth charge carriers generated by the reflected light in the TOF photodetector, wherein the reflected light is directed along a third optical path through a third microlens and a third color filter disposed on the semiconductor material, and through a third visible light photodetector disposed in the semiconductor material, wherein the third microlens and the third color filter are along the third optical path between the object the third visible light photodetector.

14. The method of claim 13, wherein the first color filter is a blue filter, the second color filter is a green filter, and the third color filter is a red filter.

15. The method of claim 11, wherein the semiconductor material comprises a silicon material.

16. The method of claim 11, wherein the light pulses and the reflected light have a wavelength of approximately 850nm.

17. An image sensor comprising:
a frontside illuminated ("FSI") image sensor including visible light photodetectors positioned to detect visible light;
a backside illuminated ("BSI") image sensor including time of flight ("TOF") photodetectors configured to capture TOF data from near-infrared light reflected from an object, wherein the BSI image sensor is optically coupled to receive the near-infrared light reflected from the object directed along an optical path through the FSI image sensor;
a semiconductor material having a thickness that is optically coupled along the optical path between the visible light photodetectors and the TOF photodetectors; and
a microlens array disposed along the optical path to receive and focus the visible light to the FSI image sensor, wherein the microlens array further receives and focuses the near-infrared light to the TOF photodetectors through at least one of the visible light photodetectors, and through the semiconductor material.

18. The image sensor of claim 17, further comprising:
a color filter array disposed along the optical path between the object and the FSI image sensor, wherein the color filter array comprises a repeating color filter pattern that includes three different colors.

19. The image sensor of claim 18, wherein each of the repeating color filter pattern corresponds with one of the TOF photodetectors.

20. An apparatus comprising:
a first photodetector array including visible light photodetectors disposed in semiconductor material to detect visible light included in light incident upon the semiconductor material, wherein the first photodetector array is a backside illuminated ("BSI") photodetector array; and
a second photodetector array including time of flight ("TOF") photodetectors disposed in the semiconductor material to capture TOF data from reflected light reflected from an object included in the light incident upon the semiconductor material, wherein the reflected light reflected from the object is directed to the TOF photodetectors along an optical path through the visible light photodetectors and through a thickness of the semiconductor material, and wherein the visible light photodetectors of the first photodetector array are disposed in the semiconductor material along the optical path between the object and the TOF photodetectors of the second photodetector array, the second photodetector array being a frontside illuminated ("FSI") photodetector array.

* * * * *